United States Patent
Abe et al.

(10) Patent No.: US 9,349,885 B2
(45) Date of Patent: May 24, 2016

(54) MULTILAYER TRANSPARENT ELECTROCONDUCTIVE FILM AND METHOD FOR MANUFACTURING SAME, AS WELL AS THIN-FILM SOLAR CELL AND METHOD FOR MANUFACTURING SAME

(75) Inventors: Yoshiyuki Abe, Tokyo (JP); Kentaro Sogabe, Tokyo (JP); Yasunori Yamanobe, Tokyo (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 331 days.

(21) Appl. No.: 13/818,401

(22) PCT Filed: Aug. 30, 2011

(86) PCT No.: PCT/JP2011/069633
§ 371 (c)(1),
(2), (4) Date: Feb. 22, 2013

(87) PCT Pub. No.: WO2012/029797
PCT Pub. Date: Mar. 8, 2012

(65) Prior Publication Data
US 2013/0153024 A1    Jun. 20, 2013

(30) Foreign Application Priority Data
Aug. 30, 2010    (JP) ................. 2010-192448

(51) Int. Cl.
*B32B 15/04*    (2006.01)
*C23C 14/06*    (2006.01)
(Continued)

(52) U.S. Cl.
CPC ...... *H01L 31/022483* (2013.01); *C23C 14/086* (2013.01); *C23C 14/34* (2013.01);
(Continued)

(58) Field of Classification Search
USPC ......... 428/426, 432, 688, 689, 699, 701, 702; 204/192.1
See application file for complete search history.

(56) References Cited

U.S. PATENT DOCUMENTS 8,828,780 B2 *   9/2014   Matsuura et al. ............. 438/71
2007/0169805 A1 * 7/2007  Sasaki et al. ................. 136/256
(Continued)

FOREIGN PATENT DOCUMENTS

EP    2 061 041 A1    5/2009
EP    2 407 575 A1    1/2012
(Continued)

OTHER PUBLICATIONS

KR1020090084539 English machine translation.*
(Continued)

*Primary Examiner* — Lauren R Colgan
(74) *Attorney, Agent, or Firm* — Oliff PLC

(57) ABSTRACT

A multilayer transparent electroconductive film is obtained by stacking a transparent electroconductive film (II) on a transparent electroconductive film (I), and in this structure, the transparent electroconductive film (I) contains one or more added elements selected from aluminum and gallium, and the content of the added elements is in a range represented by $-2.18\times[Al]+1.74\leq[Ga]\leq-1.92\times[Al]+6.10$. The transparent electroconductive film (II) contains one or more added elements selected from aluminum and gallium, and the content of the added elements is in a range represented by $-[Al]+0.30\leq[Ga]\leq-2.68\times[Al]+1.74$. In this case, [Al] is the aluminum content expressed as the atomic ratio (%) Al/(Zn+Al) and [Ga] is the gallium content expressed as the atomic ratio (%) Ga/(Zn+Ga).

12 Claims, 2 Drawing Sheets

(51) Int. Cl.
*H01L 31/0224* (2006.01)
*C23C 14/08* (2006.01)
*C23C 14/34* (2006.01)
*H01L 31/0236* (2006.01)
*H01L 31/18* (2006.01)

(52) U.S. Cl.
CPC ...... *H01L31/02366* (2013.01); *H01L 31/1884* (2013.01); *Y02E 10/50* (2013.01); *Y10T 428/24355* (2015.01); *Y10T 428/24967* (2015.01)

(56) References Cited

U.S. PATENT DOCUMENTS

| | | | |
|---|---|---|---|
| 2008/0280119 A1* | 11/2008 | Kishimoto et al. | 428/220 |
| 2009/0101493 A1* | 4/2009 | Nakayama et al. | 204/192.11 |
| 2009/0242887 A1* | 10/2009 | Yamamoto et al. | 257/59 |
| 2009/0269588 A1* | 10/2009 | Fukahori et al. | 428/412 |
| 2009/0286071 A1* | 11/2009 | Sasa | 428/336 |
| 2010/0003511 A1* | 1/2010 | So | 428/336 |
| 2010/0024862 A1* | 2/2010 | Tawada | 136/244 |
| 2010/0193352 A1* | 8/2010 | Takahashi et al. | 204/192.25 |
| 2010/0206719 A1* | 8/2010 | Takahashi et al. | 204/192.25 |
| 2011/0036399 A1* | 2/2011 | Lin et al. | 136/256 |
| 2011/0143483 A1* | 6/2011 | Jung et al. | 438/71 |
| 2011/0315214 A1* | 12/2011 | Yamanobe et al. | 136/256 |
| 2012/0024381 A1* | 2/2012 | Abe et al. | 136/261 |

FOREIGN PATENT DOCUMENTS

| | | | |
|---|---|---|---|
| JP | A-62-122011 | | 6/1987 |
| JP | A-10-306367 | | 11/1998 |
| JP | A-2001-135149 | | 5/2001 |
| JP | A-2008-110911 | | 5/2008 |
| JP | A-2009-199986 | | 9/2009 |
| KR | 1020090084539 | * | 5/2009 |
| WO | WO 2008/105198 A1 | | 9/2008 |

OTHER PUBLICATIONS

Sato et al., "Hydrogen Plasma Treatment of ZnO-Coated TCO Films," *Proc. of 23$^{rd}$ IEEE Photovoltaic Specialists Conference,* 1993, pp. 855-859, Louisville.

Minami et al., "Large-Area Milky Transparent Conducting Al-Doped ZnO Films Prepared by Magnetron Sputtering," *Japanese Journal of Applied Physics,* Aug. 1, 1992, pp. L 1106-L 1109, vol. 31, No. 8A, Part 2.

Müller et al., "Upscaling of texture-etched zinc oxide substrates for silicon thin film solar cells," *Thin Solid Films,* 2001, pp. 327-333, vol. 392.

International Search Report issued in International Application No. PCT/JP2011/069633 dated Oct. 11, 2011.

International Preliminary Report on Patentability issued in International Patent Application No. PCT/JP2011/069633 dated Mar. 5, 2013 (w/translation).

Aug. 21, 2015 Extended European Search Report issued in European Application No. 11821812.2.

* cited by examiner

MULTILAYER TRANSPARENT ELECTROCONDUCTIVE FILM AND METHOD FOR MANUFACTURING SAME, AS WELL AS THIN-FILM SOLAR CELL AND METHOD FOR MANUFACTURING SAME

FIELD OF THE INVENTION

This invention relates to a multilayer transparent electroconductive film to be formed on a translucent substrate and a method for manufacturing the same, as well as a thin-film solar cell using this transparent electroconductive film and a method for manufacturing the same.

The present application asserts priority rights based on JP Patent Application 2010-192448 filed in Japan on Aug. 30, 2010. The total contents of disclosure of the patent application of the senior filing date are to be incorporated by reference into the present application.

BACKGROUND OF THE INVENTION

A transparent electroconductive film having a high conductivity and a high transmittance in a visible light range has been used in a solar cell, a liquid crystal display element and an electrode and the like for various light receiving elements, and in addition to these, has also been used as a heat-reflective film for car windows and for construction purposes, an antistatic film and various kinds of transparent antifogging heat generators for use in refrigerated display cases and the like.

As the transparent electroconductive film, tin oxide ($SnO_2$)-based, zinc oxide (ZnO)-based and indium oxide ($In_2O_3$)-based thin films have been utilized. As the tin oxide-based film, those containing antimony as a dopant (ATO) and those containing fluorine as a dopant (FTO) have been utilized. As the zinc oxide-based film, those containing aluminum as a dopant (AZO) and those containing gallium as a dopant (GZO) have been utilized. The transparent electroconductive film that has been industrially used most widely is the indium oxide-based film, and among these, the film made of indium oxide containing tin as a dopant is referred to as ITO (Indium-Tin-Oxide) film, and this has been widely utilized because this makes it possible to easily provide, in particular, a film having a low resistivity.

In recent years, attentions have been focused on a problem with the earth environment due to an increase of carbon dioxide and the like and a problem of sudden price hikes of fossil fuels, and thin-film solar cells that can be produced at comparatively low costs have drawn public attentions. In general, the thin-film solar cell includes a transparent electroconductive film and one or more semiconductor thin-film photoelectric conversion units that are successively stacked on a translucent substrate and back electrodes. Among thin-film solar cells, since silicon materials are rich in resources, a silicon-based thin-film solar cell in which a silicon-based thin-film is used as a photoelectric conversion unit (light absorbing layer) has been quickly put into practical use, and its researches and developments have been vigorously carried out.

Moreover, various kinds of silicon-based thin-film solar cells have been introduced, and in addition to an amorphous thin-film solar cell in which an amorphous thin-film made of amorphous silicon or the like is used as a conventional light absorbing layer, a microcrystalline thin-film solar cell which uses a microcrystalline thin-film, with microcrystalline silicon being mixed in amorphous silicon, and a crystalline thin-film solar cell in which a crystalline thin film made of crystalline silicon is used have been developed, and a hybrid thin-film solar cell in which these are stacked has also been put into practical use.

With respect to the photoelectric conversion unit or the thin-film solar cell, regardless of whether the p-type and n-type conductive semiconductor layers included therein are amorphous, crystalline or microcrystalline, the unit in which a photoelectric conversion layer that occupies its main portion is made of amorphous is referred to as an amorphous unit or an amorphous thin-film solar cell, the unit in which a photoelectric conversion layer is made of crystalline is referred to as a crystalline unit or a crystalline thin-film solar cell, and the unit in which a photoelectric conversion layer is made of microcrystalline is referred to as a microcrystalline unit or a microcrystalline thin-film solar cell.

By the way, the transparent electroconductive film is used for surface transparent electrodes of a thin-film solar cell, and normally a large number of fine unevenness are formed on its surface so as to effectively confine light that is made incident on the translucent substrate side inside the photoelectric conversion unit.

As an index indicating the degree of unevenness of this transparent electroconductive film, a haze ratio is used. This corresponds to a rate obtained by dividing diffused components whose light paths are bent of light rays that are allowed to transmit the translucent substrate with the transparent electroconductive film when light from a specific light source is made incident thereon, by the entire components thereof, and is measured by using a C-light source including normal visible light. In general, as the height difference of the unevenness is increased, or as an interval between the convex portions of the unevenness is made greater, the haze ratio becomes higher, and light made incident on the photoelectric conversion unit is effectively confined so that a so-called light confinement effect becomes superior.

Regardless of whether the thin-film solar cell is a thin-film solar cell having a single-layer light absorbing layer made of amorphous silicon, crystalline silicon or microcrystalline silicon, or the above-mentioned hybrid thin-film solar cell, a high short-circuit electric current density (Jsc) can be achieved as long as a sufficient light confinement process can be carried out by increasing the haze ratio of the transparent electroconductive film, so that a thin-film solar cell having a high conversion efficiency can be manufactured.

Based upon the above-mentioned purposes, a metal oxide material, which is mainly made of tin oxide, and produced by a thermal CVD method, has been known as the transparent electroconductive film having a high degree of unevenness and a subsequent high haze ratio, and has been generally used as a transparent electrode for a thin-film solar cell.

In general, the conductivity-type semiconductor layer to be formed on the surface of a transparent electroconductive film is manufactured in a gaseous atmosphere containing hydrogen by using a plasma CVD method. In the case when a formation temperature is made higher so as to allow the conductivity-type semiconductor layer to contain microcrystal, a reducing process of metal oxide is accelerated by hydrogen that is present, with the result that in the case of a transparent electroconductive film mainly composed of tin oxide, the loss of transparency due to hydrogen reduction appears. In the case of using such a transparent electroconductive film in which transparency deteriorates, it is not possible to achieve a thin-film solar cell having high conversion efficiency.

As a method for preventing hydrogen reduction in the transparent electroconductive film mainly composed of tin oxide, non-patent document 1 has proposed a method in which, on a transparent electroconductive film that is made from tin oxide having a high degree of unevenness, and formed by a thermal CVD method, a zinc oxide film having a superior reduction resistance is thinly formed by using a sputtering method. It is disclosed that since zinc oxide has a strong bond between zinc and oxygen and exerts superior hydrogen-resistant reducibility, it is possible to maintain high transparency in the transparent electroconductive film by using the above-mentioned structure.

However, in order to obtain a transparent electroconductive film having the above-mentioned structure, a film-forming process has to be carried out by combining two kinds of methods with each other, with the result that great costs are required, failing to provide a practical method. Moreover, with respect to the method in which all the tin oxide-based transparent electroconductive film and the zinc oxide-based transparent electroconductive film are manufactured by using a sputtering method, due to reasons that a tin oxide-based transparent electroconductive film having high transparency cannot be produced by the sputtering method and the like, it is considered that the method cannot be achieved.

Non-patent document 2 has proposed a method in which a transparent electroconductive film that is mainly composed of zinc oxide and has surface unevenness and a high haze ratio is obtained by using a sputtering method. In this method, by using a sintered body target of zinc oxide to which 2 wt % of $Al_2O_3$ has been added, a sputtering film-forming process is carried out under a high gas pressure of 3 to 12 Pa, with its substrate temperature being set to 200 to 400° C. However, since the film-forming process is carried out by applying a power of DC 80 W to a target with 6 inches φ, the applied power density to the target is 0.442 $W/cm^2$, which is a very low level. For this reason, the deposition rate is extremely slow, that is, 14 to 35 nm/min, failing to provide a practical method from the industrial viewpoint.

Moreover, non-patent document 3 has disclosed a method in which, after obtaining a transparent electroconductive film mainly composed of zinc oxide and having small surface unevenness by using a conventional sputtering method, the surface of the film is etched by acid so as to form surface unevenness, thereby manufacturing a transparent electroconductive film with a high haze ratio. In this method, however, since, after a film has been produced through a dry process, by using a sputtering method that is a vacuum process, an acid etching process is carried out thereon in the air, and then dried, and since this has to be again formed into a semiconductor layer by using a CVD method that is a dry process; therefore, complicated processes are required to cause a problem of high costs or the like.

With respect to AZO containing aluminum as a dopant among zinc oxide-based transparent electroconductive film materials, a method has been proposed in which by using a target mainly composed of zinc oxide, with aluminum oxide being mixed therein, an AZO transparent electroconductive film that is C-axis oriented is manufactured by a DC magnetron spattering method (see Patent Document 1). In this case, when a DC sputtering film-forming process is carried out by increasing a power density to be applied to a target so as to form a film at high speeds, arching (abnormal discharge) tends to occur frequently. When arching frequently occurs in the manufacturing process in the film-forming line, defects tend to occur in the film, and a film having a predetermined film thickness cannot be obtained, with the result that it becomes impossible to manufacture a transparent electroconductive film having high quality in a stable manner.

For this reason, the present applicant has proposed a sputtering target, mainly composed of zinc oxide, with gallium oxide being mixed therein, to which by adding a third element (Ti, Ge, Al, Mg, In, Sn), an abnormal discharge is reduced (see Patent Document 2). In this case, a GZO sintered body containing gallium as a dopant is composed of a ZnO phase as its main phase in which 2 wt % or more of at least one member selected from the group consisting of Ga, Ti, Ge, Al, Mg, In and Sn is contained as a solid solution, with other constituent phases being a ZnO phase in which at least one member selected from the above group is not contained as a solid solution and an intermediate compound phase represented by $ZnGa_2O_4$ (spinel phase). Although this GZO target to which the third element such as Al is added makes it possible to reduce an abnormal discharge, as described in Patent Document 1, but cannot completely eliminate the abnormal discharge. In the continuous line of the film-forming process, if an abnormal discharge occurs even once, the resulting film product becomes a defective product, causing an adverse effect to the production yield.

In order to solve this problem, the present applicant has formed an oxide sintered body mainly composed of zinc oxide in which aluminum and gallium are further contained as additive elements, and by optimizing the contents of aluminum and gallium, as well as by controlling the kind and composition, in particular, the composition of the spinel crystal phase, of the crystal phase generated during the sintering process, has also proposed a target-use oxide sintered body that hardly causes particles even when a film-forming process is carried out in a sputtering apparatus for a long period of time, with no abnormal discharge being caused even upon application of a high DC power thereto (see Patent Document 3). By using this target-use oxide sintered body, it becomes possible to form a transparent electroconductive film with high quality, having a lower resistivity and a high transmittance in comparison with the conventional film, and consequently to apply this method to a manufacturing process for a solar cell with high conversion efficiency.

However, in recent years, there have been strong demands for solar cells having a higher conversion efficiency, and transparent electroconductive films having high quality have been required.

PRIOR-ART DOCUMENTS

Patent Documents

PTL 1: Japanese Patent Application Laid-Open No. 62-122011
PTL 2: Japanese Patent Application Laid-Open No. 10-306367
PTL 3: Japanese Patent Application Laid-Open No. 2008-110911

Non-Patent Documents

Non-Patent Document 1: K. Sato et. al., "Hydrogen Plasma Treatment of ZnO-Coated TCO Films", Proc. of 23th IEEE Photovoltaic Specialists Conference, Louisville, 1993, pp, 855-859.
Non-Patent Document 2: T. Minami, et. al., "Large-Area Milkey Transparent Conducting Al-Doped ZnO Films Prepared by Magnetron Sputtering", Japanese Journal of Applied Physics, [31](1992), pp. L1106-1109.
Non-Patent Document 3: J. Muller, et. al., Thin Solid Films, 392 (2001), p. 327.

SUMMARY OF THE INVENTION

In view of the above-mentioned conventional technical problems, the present invention has been devised, and its object is to provide a transparent electroconductive film having a low resistivity and high transmitting characteristic, and a method for manufacturing the same, as well as a thin-film solar cell and a method for manufacturing the same.

A multilayer transparent electroconductive film in accordance with the present invention relates to such a multilayer transparent electroconductive film in which on a transparent electroconductive film (I) mainly composed of zinc oxide, a transparent electroconductive film (II) that is mainly composed of zinc oxide, but has a composition different from that of the transparent electroconductive film (I) is stacked, and the transparent electroconductive film (I) contains one kind or more of added elements selected from aluminum and gallium, with the added element having a content in a range represented by the following inequality (1), while the transparent electroconductive film (II) contains one kind or more of added elements selected from aluminum and gallium, with the added element having a content in a range represented by the following inequality (2):

$$-2.18 \times [Al]+1.74 \leq [Ga] \leq -1.92 \times [Al]+6.10 \quad (1)$$

$$-[Al]+0.30 \leq [Ga] \leq -2.68 \times [Al]+1.74 \quad (2)$$

(where [Al] is the aluminum content expressed as the atomic ratio (%) Al/(Zn +Al), and [Ga] is the gallium content expressed as the atomic ratio (%) Ga/(Zn+Ga)).

The method for manufacturing a multilayer transparent electroconductive film in accordance with the present invention, which is a method for manufacturing a multilayer transparent electroconductive film in which on a transparent electroconductive film (I) mainly composed of zinc oxide, a transparent electroconductive film (II) that is mainly composed of zinc oxide, but has a composition different from that of the transparent electroconductive film (I) is stacked, is provided with steps of: by using a sintered body target that is mainly composed of zinc oxide and contains one kind or more of added elements selected from aluminum and gallium, with the added element having a content in a range represented by the following inequality (3), forming the transparent electroconductive film (I) by a sputtering method under conditions of a sputtering gas pressure of 0.1 to 0.8 Pa, with a substrate temperature being set to room temperature to 400° C., and by using a sintered body target that is mainly composed of zinc oxide and contains one kind or more of added elements selected from aluminum and gallium, with the added element having a content in a range represented by the following inequality (4), forming the transparent electroconductive film (II) by a sputtering method under conditions of a sputtering gas pressure of 2.0 to 15.0 Pa, with a substrate temperature being set to room temperature to 300 to 600° C.

$$-2.18 \times [Al]+1.74 \leq [Ga] \leq -1.92 \times [Al]+6.10 \quad (3)$$

$$-[Al]+0.30 \leq [Ga] \leq -2.68 \times [Al]+1.74 \quad (4)$$

(where [Al] is the aluminum content expressed as the atomic ratio (%) Al/(Zn +Al), and [Ga] is the gallium content expressed as the atomic ratio (%) Ga/(Zn+Ga)).

A thin-film solar cell in accordance with the present invention, which is a thin-film solar cell in which on a translucent substrate, a multilayer transparent electroconductive film, a photoelectric conversion layer unit and a back electrode layer are successively formed, has a structure in which the multilayer transparent electroconductive film is formed by stacking a transparent electroconductive film (II) that is mainly composed of zinc oxide, but has a composition different from that of the transparent electroconductive film (I) on a transparent electroconductive film (I) mainly composed of zinc oxide, and the transparent electroconductive film (I) contains one kind or more of added element selected from aluminum and gallium, with the added element having a content in a range represented by the following inequality (5), while the transparent electroconductive film (II) contains one kind or more of added element selected from aluminum and gallium, with the added element having a content in a range represented by the following inequality (6):

$$-2.18 \times [Al]+1.74 \leq [Ga] \leq -1.92 \times [Al]+6.10 \quad (5)$$

$$-[Al]+0.30 \leq [Ga] \leq -2.68 \times [Al]+1.74 \quad (6)$$

(where [Al] is the aluminum content expressed as the atomic ratio (%) of Al/(Zn+Al), and [Ga] is the gallium content expressed as the atomic ratio (%) of Ga/(Zn+Ga)).

The method for manufacturing a thin-film solar cell in accordance with the present invention, which is a method for manufacturing a thin-film solar cell in which on a translucent substrate, a multilayer transparent electroconductive film, a photoelectric conversion layer unit and a back electrode layer are successively formed, is provided with steps of preparing the multilayer transparent electroconductive film by stacking a transparent electroconductive film (II) that is mainly composed of zinc oxide, but has a composition different from that of the transparent electroconductive film (I) on a transparent electroconductive film (I) mainly composed of zinc oxide, and by using an oxide sintered body target that is mainly composed of zinc oxide and contains one kind or more of added element selected from aluminum and gallium, with the added element having a content in a range represented by the following inequality (7), forming the transparent electroconductive film (I) by a sputtering method under conditions of a sputtering gas pressure of 0.1 to 0.8 Pa, with a substrate temperature being set to room temperature to 400° C., and by using an oxide sintered body target that is mainly composed of zinc oxide and contains one kind or more of added element selected from aluminum and gallium, with the added element having a content in a range represented by the following inequality (8), forming the transparent electroconductive film (II) by using a sputtering method under conditions of a sputtering gas pressure of 2.0 to 15.0 Pa, with a substrate temperature being set to 300 to 600° C.

$$-2.18 \times [Al]+1.74 \leq [Ga] \leq -1.92 \times [Al]+6.10 \quad (7)$$

$$-[Al]+0.30 \leq [Ga] \leq -2.68 \times [Al]+1.74 \quad (8)$$

(where [Al] is the aluminum content expressed as the atomic ratio (%) of Al/(Zn+Al), and [Ga] is the gallium content expressed as the atomic ratio (%) of Ga/(Zn+Ga)).

Effects of Invention

In accordance with the present invention, it is possible to provide a multilayer transparent electroconductive film having a low resistivity and high transmitting characteristic. Moreover, in accordance with the present invention, since the multilayer transparent electroconductive film having low resistivity and high transmitting characteristic can be film-formed, it is possible to obtain a thin-film solar cell with high efficiency.

DETAILED DESCRIPTION OF THE INVENTION

Referring to Figures, the following description will discuss embodiments (hereinafter, referred to as "present embodiments") of the present invention in detail in the order below.
1. Multilayer transparent electroconductive film
2. Method for manufacturing multilayer transparent electroconductive film
3, Thin-film solar cell and method for manufacturing the same
<1. Multilayer Transparent Electroconductive Film>
<Composition of Transparent Electroconductive Film (I)>

The multilayer transparent electroconductive film in accordance with the present embodiment has a structure in which on a first transparent electroconductive film (hereinafter, referred to as "transparent electroconductive film (I)"), a second transparent electroconductive film (hereinafter, referred to as "transparent electroconductive film (II)") having a composition different from that of the transparent electroconductive film (I) is stacked.

The transparent electroconductive film (I) forming the multilayer transparent electroconductive film is very excellent in conductivity and has a function for improving the conductivity of the entire multilayer transparent electroconductive film. The transparent electroconductive film (I) is mainly composed of zinc oxide and contains at least one kind or more of added elements selected from aluminum and gallium, with the content of the added elements being set within a range represented by the following inequality (9):

$$-2.18\times[Al]+1.74\leq[Ga]\leq-1.92\times[Al]+6.10 \quad (9)$$

Figure 1:
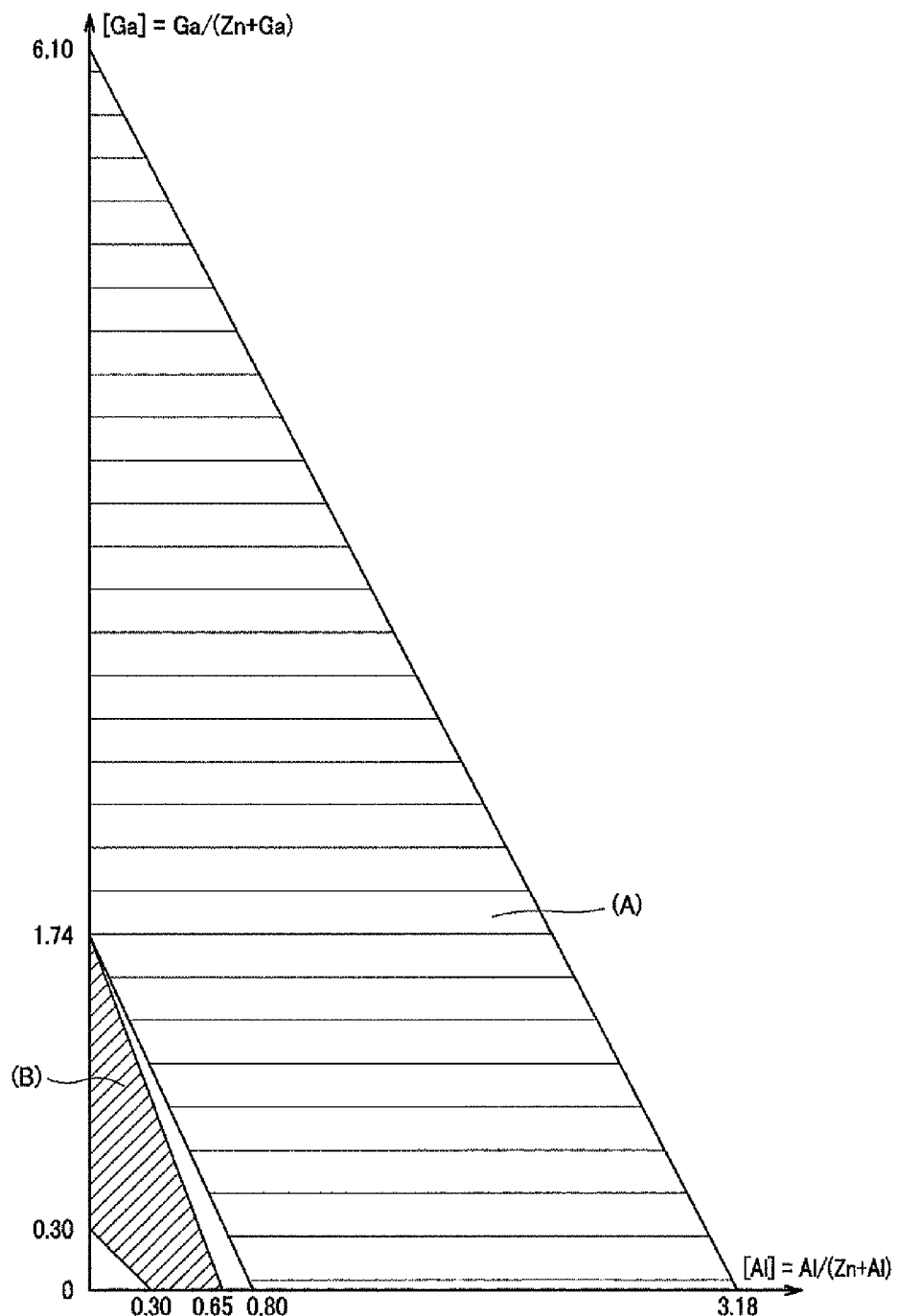
FIG. 1 is a graph that indicates a relationship between contents of aluminum and gallium in a multilayer transparent electroconductive film.

In the inequality (9), [Al] is the aluminum content expressed as the atomic ratio (%) of Al/(Zn+Al). Moreover, in the inequality (9), [Ga] is the gallium content expressed as the atomic ratio (%) of Ga/(Zn+Ga). FIG. 1 is a graph that indicates a relationship between contents of aluminum and gallium in a multilayer transparent electroconductive film. The X-axis of FIG. 1 indicates the content [Al] of aluminum in the inequality (9) and inequality (10) to be described later. Moreover, the Y-axis of FIG. 1 indicates the content [Ga] of gallium in the inequality (9) and inequality (10) to be described later. The contents of aluminum and gallium in the transparent electroconductive film (I) are preferably set within a range of region (A) shown in FIG. 1.

When $[Ga]>-1.92\times[Al]+6.10$ is held in the transparent electroconductive film (1), the conductivity becomes insufficient to cause a reduction in deposition rate. In contrast, when $-2.18\times[Al]+1.74>[Ga]$ is held in the transparent electroconductive film (I), the conductivity becomes insufficient. Consequently, for example, a multilayer transparent electroconductive film finally obtained fails to be utilized as a surface transparent electrode for a thin-film solar cell.

Moreover, since the transparent electroconductive film (I) in which zinc oxide serving as its main component has a strong bond between zinc and oxygen so that it exerts superior hydrogen-resistant reducibility, it is possible to maintain high transparency in the transparent electroconductive film, <Composition of Transparent Electroconductive Film (II)>

The transparent conductive film (II) forming the multilayer transparent electroconductive film is excellent in surface unevenness and has a function for increasing the haze ratio over the entire multilayer transparent electroconductive film. The transparent electroconductive film (II) is mainly composed of zinc oxide and contains one kind or more of added elements selected from aluminum and gallium, with the content of the added elements being preferably set within a range indicated by the following inequality (10). That is, the contents of aluminum and gallium in the transparent electroconductive film (II) are preferably set within a range of a region (B) shown in FIG. 1.

$$-[Al]+0.30\leq[Ga]\leq-2.68\times[Al]+1.74 \quad (10)$$

In the inequality (10), [Al] is the aluminum content expressed as the atomic ratio (%) of Al/(Zn+Al), and [Ga] is the gallium content expressed as the atomic ratio (%) of Ga/(Zn+Ga).

When $[Ga]>-2.68\times[Al]+1.74$ is held in the transparent electroconductive film (II), for example, aluminum and gallium tend to be easily diffused in a silicon-based thin film to be formed on the transparent electroconductive film (II), failing to obtain a silicon-based thin-film solar cell having superior characteristics. Moreover, when $[Ga]>-2.68\times[Al]+1.74$ is held in the transparent electroconductive film (II), it becomes not possible to produce a transparent electroconductive film having high surface unevenness with a high haze ratio at high speed by using a sputtering method. In contrast, when $-[Al]+0.30>[Ga]$ is held in the transparent electroconductive film (II), the conductivity becomes insufficient. Consequently, for example, a multilayer transparent electroconductive film finally obtained fails to be utilized as a surface transparent electrode for a solar cell.

Moreover, since the transparent electroconductive film (II) in which zinc oxide serving as its main component has a strong bond between zinc and oxygen makes it possible to exert superior hydrogen-resistant reducibility, it is possible to maintain high transparency in the transparent electroconductive film.
<Surface Roughness (Ra)>

The surface roughness (Ra) of the transparent electroconductive film (II) of the present embodiment is preferably set to 35.0 nm or more. In the case when the surface roughness (Ra) of the transparent electroconductive film (II) is less than 35.0 nm, it is not possible to sufficiently raise the haze ratio to cause degradation in light confinement effect upon formation of a silicon-based thin-film solar cell, failing to achieve a high conversion efficiency. In order to provide a sufficient light confinement effect, the surface roughness (Ra) of the transparent electroconductive film (II) is preferably set to 35.0 nm or more. However, in the case when the surface roughness (Ra) of the transparent electroconductive film (II) exceeds 70 nm, adverse effects tend to be given to the growth of the silicon-based thin film to be formed on the transparent electroconductive film (II), and a gap is generated in an interface between the transparent electroconductive film (II) and the silicon-based thin film to cause degradation in contact property and subsequent degradation in solar cell characteristics; therefore, this state is not preferable.
<Surface Resistance of Multilayer Transparent Electroconductive Film>

Moreover, the surface resistance of the multilayer transparent electroconductive film in accordance with the present embodiment is preferably set to 25 Ω/☐ or less. In the case when the surface resistance exceeds 25 Ω/☐, a power loss in the surface electrode becomes greater when used as the surface electrode of a solar cell, failing to achieve a solar cell with high efficiency. In the multilayer transparent electroconductive film in accordance with the present embodiment, by providing the above-mentioned film composition, the conductivity can be improved to set the surface resistance to 25 Ω/□ or less. The surface resistance of the multilayer transparent electroconductive film in accordance with the present embodiment is preferably set to 15 Ω/□ or less, more preferably, 10 Ω/□ or less.

In the multilayer transparent electroconductive film of the present embodiment, since the power loss in the surface electrode portion becomes smaller, as the surface resistance becomes lower, a solar cell having high efficiency can be realized even when it has a large cell area. For example, by preparing a zinc-oxide-based transparent electroconductive film as a crystal film, the surface resistance of the multilayer transparent electroconductive film can be reduced. In contrast, in the case when the surface resistance of the surface electrode is high, since the power loss in the surface electrode becomes larger to such a level as not to be ignorable when the solar cell is large, it becomes necessary to make the cell area of the solar cell smaller so that by wiring many small-size cells with metal wires having low resistivity, the area needs to be increased. In the case when the surface resistance of the surface electrode is 65 Ω/□ or less, a solar cell of at least 5 cm square (□) can be realized, in the case when the surface resistance of the surface electrode is 20 Ω/□ or less, a solar cell of at least 8 cm square (□) can be realized, and in the case when the surface resistance of the surface electrode is 15 Ω/□ or less, a solar cell of at least 12 cm square (□) can be realized, without the necessity of taking into consideration influences of the power loss in the surface electrode.

Solar cells with a small cell area need to be connected with one another by using metal wires, and due to such reasons as to have many gaps between the cells, or the like, not only the amount of power generation per unit area of each module formed by connecting the cells with one another becomes smaller, but also a problem of a high production cost per cell area, or the like is raised; therefore, such a solar cell is not preferable.

<Film Thickness of Transparent Electroconductive Film>

In the multilayer transparent electroconductive film in accordance with the present embodiment, since contents of added elements in the transparent electroconductive film (I) and the transparent electroconductive film (II) are set within the ranges of the above-mentioned inequality (9) and inequality (10), the above-mentioned characteristics are realized within the ranges of 200 to 700 nm in the film thickness of the transparent electroconductive film (I) and 300 to 2200 nm in the film thickness of the transparent electroconductive film (II). The thinner the film thickness of each of the transparent electroconductive films, not only the more advantageous from the viewpoint of material costs, but also the smaller the amount of light absorption of the film itself becomes, so that a film having a high transmittance can be achieved, thereby making it possible to improve the characteristics of a solar cell.

<Haze Ratio of Multilayer Transparent Electroconductive Film>

The multilayer transparent electroconductive film in accordance with the present embodiment preferably has a haze ratio of 10% or more. As described above, since the multilayer transparent electroconductive film in accordance with the present embodiment allows the transparent electroconductive film (II) to have a surface roughness (Ra) of 35.0 nm or more, the haze ratio can be set to 10% or more. The haze ratio of the multilayer transparent electroconductive film is preferably 10% or more, more preferably, 15% or more, most preferably, 20% or more. As the haze ratio of the multilayer transparent electroconductive film becomes higher, its light confinement effect becomes better so that a solar cell with high efficiency can be obtained. For example, by film-forming each of the transparent electroconductive films under sputtering conditions to be described later in detail, the haze ratio of the multilayer transparent electroconductive film can be set to 10% or more.

From the comparison of solar cells having the same structure, it is found that in a surface electrode having a haze ratio of 10% or more, an increasing effect of a photoelectric conversion efficiency caused by the light confinement effect can be obtained in comparison with a surface electrode having a haze ratio close to 0%. In order to achieve a photoelectric conversion efficiency of 8% or more in a standard thin-film silicon-based solar cell of a single structure, the haze ratio of 10% or more is indispensably required. Moreover, in order to achieve a photoelectric conversion efficiency of 12% or more under the same evaluation, a surface electrode having a haze ratio of 15% or more is preferably used. Furthermore, in order to achieve a photoelectric conversion efficiency of 15% or more, a surface electrode having a haze ratio of 20% or more is preferably used.

The multilayer transparent electroconductive film in accordance with the present embodiment is mainly composed of zinc oxide that is an inexpensive material free from exhaustion of resources, and the contents of added elements in the transparent electroconductive film (I) and the transparent electroconductive film (II) are set within the ranges of the above-mentioned inequalities of (9) and (10). With this structure, both of a high haze ratio and a high conductivity are prepared with appropriate surface unevenness. Thus, it becomes possible to provide a multilayer transparent electroconductive film having a low resistivity and a high transmitting property. Moreover, since the multilayer transparent electroconductive film can be produced by using only the sputtering method, it is superior as a transparent electroconductive film to be applied to a surface transparent electrode for a thin-film solar cell.

<2. Method for Manufacturing Multilayer Transparent Electroconductive Film>

In the method for manufacturing a multilayer transparent electroconductive film in accordance with the present embodiment, by using an oxide sintered body target that is mainly composed of zinc oxide and has one kind or more of added metal elements selected from aluminum and gallium, a transparent electroconductive film (I) and a transparent electroconductive film (II) are successively stacked on a substrate by using a sputtering method so as to form the film.

The transparent electroconductive film (I) forming the multilayer transparent electroconductive film is manufactured by the sputtering method that uses the oxide sintered body target that is mainly composed of zinc oxide and has one kind or more of added metal elements selected from aluminum and gallium. The sputtering conditions of the transparent electroconductive film (I) are preferably set to a sputtering gas pressure in a range from 0.1 to 0.8 Pa and a substrate temperature in a range from room temperature to 400° C.

In the case when the sputtering gas pressure at the time of manufacturing the transparent electroconductive film (I) is lower than 0.1 Pa, its discharging process becomes unstable, failing to carry out a sputtering film-forming process in a stable manner. In contrast, in the case when the sputtering gas pressure exceeds 0.8 Pa, a film having a fine structure is hardly obtained, with the result that a transparent electroconductive film having a superior conductivity cannot be obtained. Therefore, the sputtering gas pressure is preferably set in a range from 0.1 to 0.8 Pa.

As the kind of the sputtering gas to be used upon manufacturing the transparent electroconductive film (I), basically, an argon gas is preferably used, or a mixed gas prepared by adding to this a reducing gas, such as hydrogen gas, may be used.

The conductivity of a zinc-oxide-based transparent electroconductive film is greatly dependent on a temperature at which the substrate is heated at the time of deposition. This is because, as the temperature for heating the substrate becomes higher, the crystallinity of the film becomes better to cause an increase in the mobility of carrier electrons. Therefore, the higher the substrate temperature, the higher the mobility becomes to make the conductivity better; however, when the substrate temperature is lower than room temperature, since a film that is superior in crystallinity is hardly obtained, it is not possible to obtain a film having a superior conductivity. In the case when the substrate temperature is higher than 400° C., the amount of oxygen to be taken into a film during its deposition becomes too high, with the result that the conductivity deteriorates due to a reduction in the carrier concentration. In order to manufacture a transparent electroconductive film (I) that is superior in conductivity, the substrate heating temperature is more preferably set in a range from 150 to 300° C.

The oxide sintered body target for use in manufacturing the transparent electroconductive film (I) preferably has an aluminum content [Al] and a gallium content [Ga] that are within ranges indicated by the aforementioned inequality (9). In the case when the aluminum content [Al] and the gallium content [Ga] in the oxide sintered body target become higher than the ranges specified by the inequality (9), since the film composition is also influenced by the target composition, the conductivity of the film becomes insufficient resulting in a problem of a reduction of the deposition rate, or the like. In contrast, in the case when they become lower than the ranges specified by the inequality (9), the conductivity of the film becomes insufficient, with the result that a multilayer transparent electroconductive film finally obtained fails to be utilized as a surface transparent electrode for a thin-film solar cell.

The transparent electroconductive film (II) forming the multilayer transparent electroconductive film is preferably manufactured by a sputtering method that uses the oxide sintered body target that contains one kind or more of added metal elements selected from aluminum and gallium. The sputtering conditions of the transparent electroconductive film (II) are preferably set to a sputtering gas pressure in a range from 2.0 to 15.0 Pa and a substrate temperature in a range from 300° C. to 600° C. Moreover, the contents of aluminum and gallium of the oxide sintered body target are preferably set within ranges indicated by the aforementioned inequality (10).

In the case when the sputtering gas pressure at the time of manufacturing the transparent electroconductive film (II) is lower than 2.0 Pa, the energy of sputtering particles becomes higher to cause a vigorous migration with the result that the film surface tends to become flat, making it difficult to obtain a film having high surface unevenness. That is, when the sputtering gas pressure is lower than 2.0 Pa, it is not possible to obtain a transparent electroconductive film (II) having a surface roughness (Ra) of 35.0 nm or more. In contrast, in the case when the sputtering gas pressure exceeds 15.0 Pa, the adhesive strength of the film to the base is lowered, failing to provide a practically effective process. Moreover, in the case when the sputtering gas pressure exceeds 15.0 Pa, since the deposition rate is abruptly lowered, the productivity deteriorates.

As the kind of the sputtering gas to be used upon manufacturing the transparent electroconductive film (II), basically, an argon gas is preferably used, or a mixed gas prepared by adding to this a reducing gas, such as hydrogen gas, may be used.

In the case when the substrate temperature at the time of manufacturing the transparent electroconductive film (II) is lower than 300° C., the growth of crystal grains of the film becomes slower, failing to obtain a film that is superior in surface unevenness. In contrast, in the case when the substrate temperature is higher than 600° C., the manufacturing costs tend to increase because of an increased power for heating, or zinc oxide easily becomes volatile in the vacuum chamber to cause a reduction in the deposition rate.

In the case when the aluminum content [Al] and the gallium content [Ga] in the oxide sintered body target for use in manufacturing a transparent electroconductive film (II) become higher than the ranges specified by the inequality (10), aluminum and gallium tend to be easily diffused in a silicon-based thin film to be formed on the transparent electroconductive film (II) since the target composition is reflected to the film composition, failing to achieve a silicon-based thin-film solar cell having superior characteristics. Moreover, in the case when the aluminum content [Al] and the gallium content [Ga] in the oxide sintered body target become higher than the ranges specified by the inequality (10), it becomes difficult to manufacture a transparent electroconductive film having great surface unevenness with a high haze ratio at high speeds by using the sputtering method. In contrast, in the case when the aluminum content [Al] and the gallium content [Ga] in the oxide sintered body target become smaller than the ranges specified by the inequality (10), the conductivity of the film becomes insufficient, resulting in a failure in utilizing a multilayer transparent electroconductive film finally obtained as a surface transparent electrode for a thin-film solar cell.

As described above, since the method for manufacturing a multilayer transparent electroconductive film in accordance with the present embodiment makes it possible to produce the multilayer transparent electroconductive film by using only the sputtering method, the productivity becomes very high. Moreover, the method for manufacturing a multilayer transparent electroconductive film in accordance with the present embodiment makes it possible to provide a multilayer transparent electroconductive film having a lower resistivity by stacking the transparent electroconductive film (II) on the transparent electroconductive film (I) that has a lower resistivity than that of the transparent electroconductive film (II). Moreover, the method for manufacturing a transparent electroconductive film in accordance with the present embodiment makes it possible to provide a multilayer transparent electroconductive film at lower costs in comparison with the transparent electroconductive film produced by using a conventional thermal CVD method.

<3. Thin-film Solar Cell and Method for Manufacturing Same>

A thin-film solar cell in accordance with the present embodiment has a structure in which, for example, a multilayer transparent electroconductive film, a photoelectric conversion layer unit and a back electrode layer are stacked on a translucent substrate in this order.

The thin-film solar cell of the present invention is a photoelectric conversion element characterized by using the above-mentioned multilayer transparent electroconductive film as its electrode. The structure of the solar cell element is not particularly limited, and a PN conjunction type in which a p-type semiconductor and an n-type semiconductor are stacked, a PIN conjunction type in which an insulating layer (I layer) is interpolated between a p-type semiconductor and an n-type semiconductor, or the like is proposed.

Moreover, the thin-film solar cell is mainly classified by the kinds of semiconductors into a silicon-based solar cell in which a silicon-based semiconductor thin film, such as microcrystalline silicon and/or amorphous silicon, is used as a photoelectric conversion element, a compound thin-film-based solar cell in which a thin film of a compound semiconductor, made of materials, typically represented by CuInSe-based, Cu(In, Ga)Se-based, Ag(In, Ga)Se-based, CuInS-based, Cu(In, Ga)S-based, Ag(In, Ga)S-based materials or the like, and solid solutions of these, or GaAs-based or CdTe-based materials or the like, is used as a photoelectric conversion element, and a pigment sensitizing type solar cell (referred to also as "Grätzel cell-type solar cell") that uses an organic pigment, and the solar cell in accordance with the present invention is included in any of these cases, and by using the above-mentioned multilayer electroconductive film as the electrode, a high efficiency can be obtained. In particular, in the silicon-based solar cell and the compound thin-film-based solar cell, it is indispensably required to use a transparent electroconductive film as the electrode on the side (light-receiving side, surface side) on which solar light is made incident, and by using the multilayer transparent electroconductive film of the present invention, a characteristic having a high conversion efficiency can be exerted.

The p-type and n-type electroconductive semiconductor layers of a photoelectric conversion unit have functions for generating an internal electric field inside the photoelectric conversion unit. The value of an open-circuit voltage (Voc) that is one of essential characteristics of the thin-film solar cell is changed depending on the size of this internal electric field. The i-type layer, which is practically an intrinsic semiconductor layer, occupies most of the portions of the thickness of the photoelectric conversion unit. The photoelectric conversion function is mainly generated in the i-type layer. For this reason, the i-type layer is normally referred to as an i-type photoelectric conversion layer or is simply referred to as a photoelectric conversion layer. Not limited to the intrinsic semiconductor layer, the photoelectric conversion layer may be formed as a layer doped with a trace amount of a p-type or n-type material within a range in which the loss of light absorbed by the doped impurity (dopant) does not cause any problems.

Figure 2:
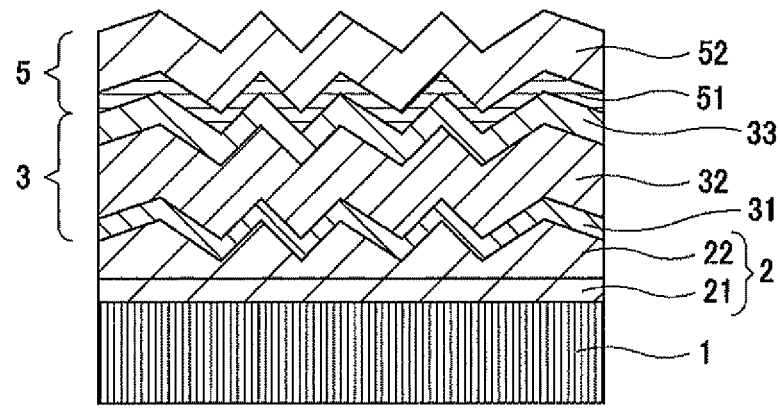
FIG. 2 is a cross-sectional view showing a structural example of a thin-film solar cell in which an amorphous silicon thin film is used as a photoelectric conversion unit.

FIG. 2 is a drawing that shows one example of a structure of a silicon-based amorphous thin-film solar cell. As the silicon-based thin-film solar cell using the silicon-based thin film as its photoelectric conversion unit (light absorbing layer), in addition to the amorphous thin-film solar cell, a microcrystalline thin-film solar cell and a crystalline thin-film solar cell, together with a hybrid thin-film solar cell in which these are stacked, have been put into practical use. Additionally, as described earlier, in the photoelectric conversion unit or the thin-film solar cell, the unit having a photoelectric conversion layer made of an amorphous material, which occupies its main portion, is referred to as an amorphous unit or an amorphous thin-film solar cell. Moreover, the unit having a photoelectric conversion layer made of a crystalline material is referred to as a crystalline unit or a crystalline thin-film solar cell. Furthermore, the unit having a photoelectric conversion layer made of a microcrystalline material is referred to as a microcrystalline unit or a microcrystalline thin-film solar cell.

As a method for improving the conversion efficiency of such a thin-film solar cell, a method has been proposed in which two or more photoelectric conversion units are stacked to form a tandem-type solar cell. For example, in this method, a front unit including a photoelectric conversion layer having a large band gap is installed on the light incident side of a thin-film solar cell, while on the rear side, a rear unit including a photoelectric conversion layer having a small band gap is successively installed. With this structure, a photoelectric conversion process is carried out over a wide wavelength range of incident light so that the conversion efficiency can be improved over the entire solar cell. Among these tandem-type solar cells, in particular, those having a structure in which an amorphous photoelectric conversion unit and a crystalline or microcrystalline photoelectric conversion unit are stacked each other are referred to as hybrid thin-film solar cells.

Figure 3:
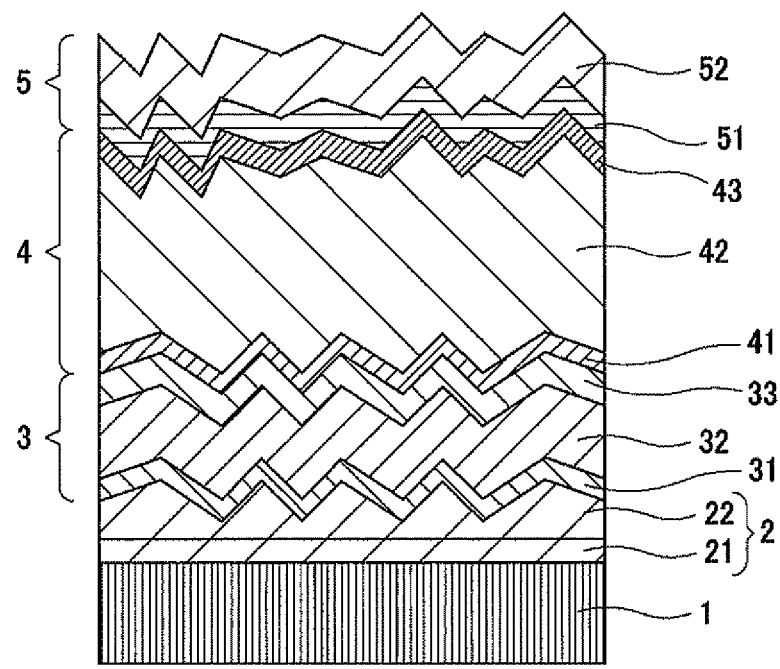
FIG. 3 is a cross-sectional view showing a structural example of a hybrid thin-film solar cell in which an amorphous silicon thin film and a crystalline silicon film are stacked as a photoelectric conversion unit.

FIG. 3 is a drawing that shows one example of a structure of the hybrid thin-film solar cell. In the hybrid thin-film solar cell, for example, a wavelength range of light that can be photoelectric converted by the i-type amorphous silicon is up to about 800 nm on the long wavelength side; however, the i-type crystalline or microcrystalline silicon makes it possible to photoelectric convert light in a wavelength range up to about 1150 nm, which is longer than the above-mentioned wavelength.

Referring to FIGS. 2 and 3, the following description will discuss the structure of a thin-film solar cell in more detail. In FIGS. 2 and 3, on a translucent substrate 1, a zinc-oxide-based multilayer transparent electroconductive film 2 composed of a transparent electroconductive film 21 serving as the aforementioned transparent electroconductive film (I) and a transparent electroconductive film 22 serving as the transparent electroconductive film (II) are formed. As the translucent substrate 1, a plate-shaped member or a sheet-shaped member, made of glass or a transparent resin, or the like, may be used. On the multilayer transparent electroconductive film 2, an amorphous photoelectric conversion unit 3 is formed. The amorphous photoelectric conversion unit 3 is constituted by an amorphous p-type silicon carbide layer 31, a non-dope amorphous i-type silicon photoelectric conversion layer 32 and an n-type silicon-based interface layer 33. The amorphous p-type silicon carbide layer 31 is formed at a substrate temperature of 180° C. or less so as to prevent a reduction of transmittance due to a reducing process by the transparent electroconductive laminate 2.

In the hybrid thin-film solar cell shown in FIG. 3, a crystalline photoelectric conversion unit 4 is formed on the amorphous photoelectric conversion unit 3. The crystalline photoelectric conversion unit 4 is composed of a crystalline p-type silicon layer 41, a crystalline i-type silicon photoelectric conversion layer 42 and a crystalline n-type silicon layer 43. The formation of each of the amorphous photoelectric conversion unit 3 and the crystalline photoelectric conversion unit 4 (hereinafter, these two units are collectively referred to simply as "photoelectric conversion units") is preferably carried out by a high-frequency plasma CVD method. The forming conditions of the photoelectric conversion unit are preferably set to a substrate temperature in a range from 100° C. to 250° C. (however, in the case of an amorphous p-type silicon carbide layer 31, to 180° C. or less), a pressure in a range from 30 to 1500 Pa, and a high-frequency power density in a range from 0.01 to 0.5 W/cm$^2$. As a material gas for use in forming the photoelectric conversion unit, a silicon-containing gas, such as $SiH_4$, $Si_2H_6$ or the like, or a mixed gas prepared by mixing $H_2$ with these gases may be used. As a dopant gas for use in forming the p-type or n-type layer in the photoelectric conversion unit, $B_2H_6$, $PH_3$, or the like is preferably used.

On the n-type silicon-based interface layer 33 shown in FIG. 2 or the n-type silicon-based interface layer 43 shown in FIG. 3, a back electrode 5 is formed. The back electrode 5 is composed of a transparent reflective layer 51 and a back reflective layer 52. As the transparent reflective layer 51, a metal oxide, such as ZnO, ITO or the like, may be preferably used. As the back reflective layer 52, Ag, or Al or an alloy of these may be preferably used.

Upon forming the back electrode 5, a method, such as sputtering, vapor deposition or the like, is preferably used. The back electrode 5 is normally set to have a thickness of 0.5 to 5 μm, preferably, 1 to 3 μm. After the formation of the back electrode 5, by heating this at an ambient temperature of the formation temperature or more of the amorphous p-type silicon carbide layer 31 under the vicinity of the atmospheric pressure, a solar cell is completed. As the gas to be used in the heating atmosphere, the air, nitrogen, a mixture of nitrogen and oxygen, or the like is preferably used. In this case, the vicinity of the atmospheric pressure refers to an approximate range of 0.5 to 1.5 atmospheric pressure.

As described above, in accordance with the method for manufacturing a thin-film solar cell of the present embodiment, it becomes possible to provide a silicon-based thin-film solar cell using the multilayer transparent electroconductive film 2 as the electrode. Moreover, in the method for manufacturing a thin-film solar cell in accordance with the present embodiment, by stacking the transparent electroconductive film (II) on the transparent electroconductive film (I), a multilayer transparent electroconductive film is formed so that it is possible to obtain a transparent electroconductive film having a lower resistivity for use in a surface transparent electrode of a thin-film solar cell. Furthermore, the multilayer transparent electroconductive film is provided at low costs in comparison with the transparent electroconductive film produced by using a conventional thermal CVD method. Since the method for manufacturing a thin-film solar cell in accordance with the present embodiment makes it possible to provide a silicon-based thin-film solar cell with high efficiency at low costs by using simple processes, it is very useful from the industrial point of view.

Additionally, FIG. 3 illustrates a structure of a hybrid thin-film solar cell; however, it is not necessarily required to provide two photoelectric conversion units, and an amorphous or crystalline single structure or a laminated-type solar cell structure with three layers or more may be used.

EXAMPLES

The following description will discuss specific examples of the present invention. However, the scope of the present invention is not intended to be limited by any of the following examples.

(1) The film thickness was measured by the following sequence of steps. Prior to a deposition, one portion of a substrate was preliminarily coated with an oil-based magic ink, and after the deposition, the magic ink was wiped off with ethanol so that a portion without a film was formed; thus, a step difference between the portion with the film and the portion without the film was measured and found by a contact type surface-shape measuring device (Alpha-Step IQ, made by KLA Tencor Corporation).

(2) The composition of the resulting transparent electroconductive film was qualitatively analyzed by using an ICP (Inductively coupled plasma) optical emission spectral analysis technique (using SPS4000 by Seiko Instruments Inc.).

(3) The crystallinity and orienting property of the film was examined by an X-ray diffraction measurement using an X-ray diffraction device (M18XHF 22, made by MAC Science Co., Ltd.) in which CuKα ray was utilized.

(4) The resistivity of each transparent electroconductive film was measured by a 4 terminal 4 probe method using a resistivity measuring meter, Loresta EP (MCP-T360, made by Dia Instruments Co., Ltd.).

(5) The total ray transmittance and parallel ray transmittance as well as the total ray reflectance and parallel ray reflectance including the substrate were measured by a spectrophotometer (U-4000, made by Hitachi, Ltd.).

(6) The haze ratio of the multilayer transparent electroconductive film was evaluated by a Haze meter (HM-150, made by Murakami Color Research Laboratory Co., Ltd.) based upon JIS standard K7136. The surface roughness (Ra) of the multilayer transparent electroconductive film was measured within an area of 5 μm×5 μm by using an atomic power microscope (NS-III, D5000 system, made by Digital Instruments Inc.).

Example 1

By using two kinds of zinc-oxide-based sintered body targets (made by Sumitomo Metal Mining Co., Ltd.) having different components in which only gallium was contained as an added element, a multilayer transparent electroconductive film was produced by successively stacking the transparent electroconductive film (I) and the transparent electroconductive film (II) in the following manner.

The compositions of the targets thus used was quantitatively analyzed by ICP emission spectral analysis method (SPS4000, made by Seiko Instruments Inc.). The target composition for use in forming the transparent electroconductive film (I) was 1.74 in Ga/(Zn+Ga)(ratio of the number of atoms). The target composition for use in forming the transparent electroconductive film (II) was 0.87 in Ga/(Zn+Ga) (ratio of the number of atoms). The purity of each of the targets was 99.999%. The size of each of the targets was 6 inches ($\phi$)×5 mm (thickness).

Each of these sputtering targets of two compositions was attached to a cathode for a ferromagnetic target of a direct-current magnetron sputtering apparatus (with a maximum horizontal magnetic field intensity of about 80 kA/m (1 kG) at a position 1 cm apart from the surface of the target) (SPF503K, made by Tokki Corporation), and a glass substrate of Corning 7059 with a thickness of 1.1 mm was attached to the opposed surface of the sputtering target. Moreover, the distance between the sputtering target and the substrate was set to 50 mm. Additionally, the average light transmittance in the visible light wavelength range of the glass substrate of Corning 7059 itself was 92%.

<Preparation of Transparent Conductive Film (I)>

Next, the chamber was evacuated to vacuum, and at the time when its vacuum degree had reached $2\times10^{-4}$ Pa or less, an Ar gas having a purity of 99.9999% by mass was introduced into the chamber so that the gas pressure was set to 0.5 Pa. With the substrate temperature being set to 200° C., a direct current applied power of 400 W (applied power density to the target=direct current applied power÷target surface area=400 W÷181 cm$^2$=2.210 W/cm$^2$) was applied between the target for the transparent electroconductive film (I) and the substrate so that a direct current plasma was generated. After having carried out a pre-sputtering process for 10 minutes so as to clean the target surface, a sputtering film-forming process was carried out with the substrate being allowed to stand still at a portion directly above the center of the target for use in manufacturing the transparent electroconductive film (I), a transparent electroconductive film (I) having a predetermined thickness was formed on the substrate. Here, in the case when the composition of the transparent electroconductive film (I) was evaluated by carrying out a composition analysis on a film prepared on a synthesized quartz substrate under the above-mentioned sputtering conditions by using the ICP emission spectral analysis method, it was confirmed that a film having the same composition as that of the target could be obtained. Moreover, with respect to the film thickness of the transparent electroconductive film (II), the evaluation was carried out on a film formed on a synthesized quartz substrate by using the above-mentioned sputtering conditions so that the film thickness was determined.

<Preparation of Transparent Conductive Film (II)>

Next, on the transparent electroconductive film (I), a transparent electroconductive film (II) was formed in the following sequence of processes. At the time when its vacuum degree had reached $2 \times 10^{-4}$ Pa or less, an Ar gas having a purity of 99.9999% by mass was introduced into the chamber so that the gas pressure was set to 5.0 Pa. With the substrate temperature being set to 450° C., a direct current applied power of 400 W (applied power density to the target=direct current applied power÷target surface area=400 W÷181 $cm^2$=2.210 $W/cm^2$) was applied between the target for the transparent electroconductive film (II) and the substrate so that a direct current plasma was generated. After having carried out a pre-sputtering process for 10 minutes so as to clean the target surface, a sputtering film-forming process was carried out with the substrate being allowed to stand still at a portion directly above the center of the target for use in manufacturing the transparent electroconductive film (II), a transparent electroconductive film (II) having a predetermined thickness was formed on the substrate. Here, in the case when the composition of the transparent electroconductive film (II) was evaluated by carrying out a composition analysis on a film prepared on a synthesized quartz substrate under the above-mentioned sputtering conditions by using the ICP emission spectral analysis method, it was confirmed that a film having the same composition as that of the target could be obtained. Moreover, with respect to the film thickness of the transparent electroconductive film (II), the evaluation was carried out on a film formed on a synthesized quarts substrate by using the above-mentioned sputtering conditions so that the film thickness was determined.

<Evaluation of Multilayer Transparent Electroconductive Film>

The surface resistance of the multilayer transparent electroconductive film obtained in example 1 was measured by using the above-mentioned method, and the total ray transmittance and parallel ray transmittance as well as the total ray reflectance and parallel ray reflectance including the substrate, and the haze ratio were measured by the above-mentioned methods. Table 1 shows the results.

TABLE 1

| | Manufacturing Conditions of Transparent Electroconductive Film (I) | | | Characteristics of Transparent Electroconductive Film (I) | | | Manufacturing Conditions of Transparent Electroconductive Film (II) | | |
|---|---|---|---|---|---|---|---|---|---|
| | | | | Film Composition | | | | | |
| | Gas Pressure (Pa) | Gas Type (Ar/$H_2$) | Substrate Temperature (° C.) | Al/(Zn + Al) Atom % | Ga/(Zn + Ga) Atom % | Film Thickness (nm) | Gas Pressure (Pa) | Gas Type (Ar/$H_2$) | Substrate Temperature (° C.) |
| Comparative Example 1 | 0.5 | 100/0 | 200 | 0 | 1.31 | 700 | 5.0 | 100/0 | 450 |
| Example 1 | 0.5 | 100/0 | 200 | 0 | 1.74 | 650 | 5.0 | 100/0 | 450 |
| Example 2 | 0.5 | 100/0 | 200 | 0 | 2.62 | 420 | 5.0 | 100/0 | 450 |
| Example 3 | 0.5 | 100/0 | 200 | 0 | 4.96 | 205 | 5.0 | 100/0 | 450 |
| Example 4 | 0.5 | 100/0 | 200 | 0 | 6.10 | 550 | 5.0 | 100/0 | 450 |
| Comparative Example 2 | 0.5 | 100/0 | 200 | 0 | 6.96 | 650 | 5.0 | 100/0 | 450 |
| Comparative Example 3 | 0.3 | 100/0 | 250 | 0 | 3.48 | 365 | 3.0 | 100/0 | 450 |
| Example 5 | 0.3 | 100/0 | 250 | 0 | 3.48 | 350 | 3.0 | 100/0 | 450 |
| Example 6 | 0.3 | 100/0 | 250 | 0 | 3.48 | 375 | 3.0 | 100/0 | 450 |
| Example 7 | 0.3 | 100/0 | 250 | 0 | 3.48 | 368 | 3.0 | 100/0 | 450 |
| Comparative Example 4 | 0.3 | 100/0 | 250 | 0 | 3.48 | 360 | 3.0 | 100/0 | 450 |
| Comparative Example 5 | 0.1 | 100/0 | 200 | 0.40 | 0 | 700 | 8.0 | 100/0 | 500 |
| Example 8 | 0.1 | 100/0 | 200 | 0.80 | 0 | 650 | 8.0 | 100/0 | 500 |
| Example 9 | 0.1 | 100/0 | 200 | 2.39 | 0 | 205 | 8.0 | 100/0 | 500 |
| Example 10 | 0.1 | 100/0 | 200 | 3.17 | 0 | 550 | 8.0 | 100/0 | 500 |
| Comparative Example 6 | 0.1 | 100/0 | 200 | 3.98 | 0 | 600 | 8.0 | 100/0 | 500 |
| Comparative Example 7 | 0.2 | 100/0 | 250 | 1.59 | 0 | 330 | 8.0 | 100/0 | 550 |
| Example 11 | 0.2 | 100/0 | 250 | 1.59 | 0 | 350 | 8.0 | 100/0 | 550 |
| Example 12 | 0.2 | 100/0 | 250 | 1.59 | 0 | 350 | 8.0 | 100/0 | 550 |
| Example 13 | 0.2 | 100/0 | 250 | 1.59 | 0 | 350 | 8.0 | 100/0 | 550 |
| Comparative Example 8 | 0.2 | 100/0 | 250 | 1.59 | 0 | 350 | 8.0 | 100/0 | 550 |
| Example 14 | 0.8 | 100/0 | 300 | 0.98 | 1.97 | 410 | 2.0 | 100/0 | 450 |
| Example 15 | 0.8 | 100/0 | 300 | 1.09 | 3.05 | 450 | 12.0 | 100/0 | 450 |
| Example 16 | 0.8 | 100/0 | 300 | 1.09 | 3.05 | 510 | 12.0 | 100/0 | 450 |
| Example 17 | 0.8 | 100/0 | 300 | 0.42 | 0.87 | 520 | 15.0 | 100/0 | 450 |
| Example 18 | 0.8 | 100/0 | 300 | 0.12 | 0.87 | 510 | 15.0 | 100/0 | 450 |

TABLE 1-continued

| | | Characteristics of Transparent Electroconductive Film (II) | | | Characteristics of Multilayer transparent electroconductive film (Substrate/ Transparent Electroconductive Film (I)/ Transparent Electroconductive Film (II)) | | |
|---|---|---|---|---|---|---|---|
| | | Film Composition | | | | | |
| | | Al/(Zn + Al) Atom % | Ga/(Zn + Ga) Atom % | Film Thickness (nm) | Surface Resistance (Ω/□) | Haze Ratio (%) | Surface Roughness Ra (nm) |
| | Comparative Example 1 | 0 | 0.87 | 525 | 30.5 | 16 | 65.2 |
| | Example 1 | 0 | 0.87 | 520 | 24.5 | 15 | 61.6 |
| | Example 2 | 0 | 0.87 | 550 | 16.5 | 15 | 60.4 |
| | Example 3 | 0 | 0.87 | 535 | 8.7 | 17 | 67.3 |
| | Example 4 | 0 | 0.87 | 535 | 20.4 | 16 | 63.1 |
| | Comparative Example 2 | 0 | 0.87 | 525 | 27.8 | 15 | 61.0 |
| | Comparative Example 3 | 0 | 0.21 | 530 | 26.5 | 25 | 37.2 |
| | Example 5 | 0 | 0.30 | 510 | 23.5 | 18 | 68.1 |
| | Example 6 | 0 | 0.87 | 520 | 14.3 | 15 | 59.8 |
| | Example 7 | 0 | 1.74 | 550 | 10.8 | 11 | 46.5 |
| | Comparative Example 4 | 0 | 2.18 | 580 | 9.5 | 8 | 33.8 |
| | Comparative Example 5 | 0.43 | 0 | 550 | 30.5 | 17 | 63.3 |
| | Example 8 | 0.43 | 0 | 520 | 24.5 | 15 | 56.7 |
| | Example 9 | 0.43 | 0 | 535 | 8.7 | 16 | 60.1 |
| | Example 10 | 0.43 | 0 | 535 | 20.4 | 15 | 58.1 |
| | Comparative Example 6 | 0.43 | 0 | 535 | 27.8 | 14 | 55.1 |
| | Comparative Example 7 | 0.22 | 0 | 550 | 28.5 | 23 | 35.5 |
| | Example 11 | 0.31 | 0 | 535 | 24.8 | 18 | 67.1 |
| | Example 12 | 0.43 | 0 | 515 | 16.8 | 14 | 57.0 |
| | Example 13 | 0.64 | 0 | 560 | 13.6 | 12 | 48.11 |
| | Comparative Example 8 | 0.71 | 0 | 545 | 10.5 | 7 | 30.6 |
| | Example 14 | 0.28 | 0.28 | 450 | 8.5 | 17 | 70.3 |
| | Example 15 | 0.32 | 0.85 | 2180 | 12.1 | 25 | 38.5 |
| | Example 16 | 0.16 | 0.16 | 306 | 7.3 | 13 | 52.1 |
| | Example 17 | 0.32 | 0.85 | 1420 | 19.1 | 10 | 39.1 |
| | Example 18 | 0.16 | 0.16 | 850 | 24.5 | 23 | 35.1 |

The multilayer transparent electroconductive film obtained in example 1 had a surface resistance of 25 Ω/□ or less, a surface roughness (Ra) measured by an atomic force microscope of 35 nm or more, and a haze ratio of 10% or more. When the surface SEM observation was carried out on this transparent electroconductive film, it was found that the film was composed of large grains with large surface unevenness. Therefore, since the multilayer transparent electroconductive film obtained in example 1 was superior in conductivity and also superior in light confinement property, it was very effectively used as a surface electrode for a solar cell.

Examples 2 to 4

In examples 2 to 4, the same sequence of processes as those of example 1 were carried out except that the target for use in manufacturing the transparent electroconductive film (I) was changed to a zinc-oxide-based sintered body target (made by Sumitomo Metal Mining Co., Ltd.) containing only gallium at a rate shown below, with the film thicknesses of the transparent electroconductive film (I) and the transparent electroconductive film (II) being changed, so that a transparent electroconductive laminate was manufactured. That is, the target of example 2 had 2.62 in Ga/(Zn+Ga)(ratio of the number of atoms), the target of example 3 had 4.96 in Ga/(Zn +Ga)(ratio of the number of atoms), and the target of example 4 had 6.10 in Ga/(Zn+Ga)(ratio of the number of atoms). The compositions of transparent electroconductive films of examples 2 to 4 were measured by using the same method, and it was found that in any of the cases, a transparent electroconductive film having the same composition as the target composition could be obtained.

Each of the multilayer transparent electroconductive films obtained in examples 2 to 4 had a surface resistance of 25 Ω/□ or less, a surface roughness (Ra) measured by an atomic force microscope of 35 nm or more, and a haze ratio of 10% or more. When the surface SEM observation was carried out on each of the multilayer transparent electroconductive films obtained in examples 2 to 4, it was found that the resulting film was composed of large grains with large surface unevenness. Therefore, since each of the multilayer transparent electroconductive films obtained in examples 2 to 4 was superior in conductivity and also superior in light confinement effect, it was very effectively used as a surface electrode for a solar cell.

Comparative Examples 1 and 2

In comparative examples 1 and 2, the same sequence of processes as those of example 1 were carried out except that the target for use in manufacturing the transparent electroconductive film (I) was changed to a zinc-oxide-based sintered body target (made by Sumitomo Metal Mining Co., Ltd.) containing only gallium at a rate shown below, with the film thicknesses of the transparent electroconductive film (I) and the transparent electroconductive film (II) being changed, so that a transparent electroconductive laminate was manufactured. That is, the target of comparative example 1 had 1.31 in Ga/(Zn+Ga)(ratio of the number of atoms) and the target of comparative example 2 had 6.96 in Ga/(Zn+Ga) (ratio of the number of atoms). The compositions of transparent electroconductive films of comparative examples 1 and 2 were measured by using the same method, and it was found that in each of the cases, a transparent electroconductive film having the same composition as the target composition could be obtained.

Each of the multilayer transparent electroconductive films obtained in comparative examples 1 and 2 had sufficient values in the haze ratio and surface roughness (Ra); however, its surface resistance was greater than 25 Ω/□. Therefore, since the multilayer transparent electroconductive films were inferior in conductivity, they were not applicable to a surface electrode for use in a solar cell.

Example 5

In example 5, the target compositions to be used upon manufacturing the transparent electroconductive film (I) and the transparent electroconductive film (II) were changed as described below, and by using the same film-forming apparatus, a multilayer transparent electroconductive film was manufactured. That is, as each of the targets, a zinc-oxide-based sintered body containing only gallium as an added element was used, and in the transparent electroconductive film (I), the content thereof was set to 3.48 in Ga/(Zn+Ga) (ratio of the number of atoms) and in the transparent electroconductive film (II), the content thereof was set to 0.30 in Ga/(Zn+Ga)(ratio of the number of atoms). Moreover, the other manufacturing conditions, compositions and film thicknesses of the transparent electroconductive film (I) and the transparent electroconductive film (II) are shown in Table 1.

The multilayer transparent electroconductive film obtained in example 5 had a surface resistance of 25 Ω/□ or less, a surface roughness (Ra) measured by an atomic force microscope of 35 nm or more, and a haze ratio of 10% or more. When the surface SEM observation was carried out on the multilayer transparent electroconductive film, it was found that the resulting film was composed of large grains with large surface unevenness. Therefore, since the multilayer transparent electroconductive film obtained in example 5 was superior in conductivity and also superior in light confinement effect, it was very effectively used as a surface electrode for a solar cell.

Examples 6 and 7

In examples 6 and 7, the same sequence of processes as those of example 5 were carried out except that the target for use in manufacturing the transparent electroconductive film (II) was changed to a zinc-oxide-based sintered body target (made by Sumitomo Metal Mining Co., Ltd.) containing only gallium at a rate shown below, with the film thicknesses of the transparent electroconductive film (I) and the transparent electroconductive film (II) being changed, so that a transparent electroconductive laminate was manufactured. That is, the target of example 6 had 0.87 in Ga/(Zn+Ga)(ratio of the number of atoms) and the target of example 7 had 1.74 in Ga/(Zn+Ga)(ratio of the number of atoms). The compositions of the films were measured by using the same method, and it was found that in each of the cases, a film having the same composition as the target composition could be obtained.

Each of the multilayer transparent electroconductive films obtained in examples 6 and 7 had a surface resistance of 25 Ω/□ or less, a surface roughness (Ra) measured by an atomic force microscope of 35 nm or more, and a haze ratio of 10% or more. When the surface SEM observation was carried out on the laminate, it was found that the resulting film was composed of large grains with large surface unevenness. Therefore, since the multilayer transparent electroconductive films obtained in examples 6 and 7 were superior in conductivity and also superior in light confinement effect, they were very effectively used as a surface electrode for a solar cell.

Comparative Examples 3 and 4

In comparative examples 3 and 4, the same sequence of processes as those of example 5 were carried out except that the target for use in manufacturing the transparent electroconductive film (II) was changed to a zinc-oxide-based sintered body target (made by Sumitomo Metal Mining Co., Ltd.) containing only gallium at a rate shown below, with the film thicknesses of the transparent electroconductive film (I) and the transparent electroconductive film (II) being changed, so that a transparent electroconductive laminate was manufactured. That is, the target of comparative example 3 had 0.21 in Ga/(Zn+Ga)(ratio of the number of atoms) and the target of comparative example 4 had 2.18 in Ga/(Zn+Ga) (ratio of the number of atoms). The compositions of the films were measured by using the same method, and it was found that in each of the cases, a film having the same composition as the target composition could be obtained.

The multilayer transparent electroconductive film obtained in comparative example 3 had sufficient values in the haze ratio and surface roughness (Ra); however, its surface resistance was greater than 25 Ω/□. Therefore, since the multilayer transparent electroconductive film obtained in comparative example 3 was inferior in conductivity, it was not applicable to a surface electrode for use in a solar cell.

Moreover, the multilayer transparent electroconductive film obtained in comparative example 4 had a sufficiently low value in surface resistance; however, it failed to provide a sufficient value in the haze ratio and surface roughness (Ra). Therefore, it was found that since the multilayer transparent electroconductive film obtained in comparative example 4 was inferior in light confinement effect, it was not applicable to a surface electrode for use in a solar cell.

Example 8

In example 8, the same sequence of processes as those of example 1 were carried out except that the targets for use in manufacturing the transparent electroconductive film (I) and transparent electroconductive film (II) were changed to zinc-oxide-based sintered body targets (made by Sumitomo Metal Mining Co., Ltd.) containing only aluminum at a rate shown below, with the film thicknesses of the transparent electroconductive film (I) and the transparent electroconductive film (II) being further changed, so that a transparent electroconductive laminate was manufactured. That is, the transparent electroconductive film (I) had 0.80 in Al/(Zn+Al)(ratio of the number of atoms) and the transparent electroconductive film (II) had 0.43 in Al/(Zn+Al)(ratio of the number of atoms). When the compositions of the films were measured by using the same method, it was found that in each of the cases, a transparent electroconductive film having the same composition as the target composition could be obtained.

The multilayer transparent electroconductive film obtained in example 8 had a surface resistance of 25 Ω/□ or less, a surface roughness (Ra) of 35 nm or more, and a haze ratio of 10% or more. When the surface SEM observation was carried out on the laminate, it was found that the resulting film was composed of large grains with large surface unevenness. Therefore, since the multilayer transparent electroconductive film obtained in example 8 was superior in conductivity and also superior in light confinement effect, it could be very effectively used as a surface electrode for a solar cell.

Examples 9 and 10

In examples 9 and 10, the same sequence of processes as those of example 8 were carried out except that the target for use in manufacturing the transparent electroconductive film (I) was changed to a zinc-oxide-based sintered body target (made by Sumitomo Metal Mining Co., Ltd.) containing only aluminum at a rate shown below, with the film thicknesses of the transparent electroconductive film (I) and the transparent electroconductive film (II) being further changed, so that a transparent electroconductive laminate was manufactured. That is, the transparent electroconductive film (I) in example 9 had 2.39 in Al/(Zn+Al)(ratio of the number of atoms) and the transparent electroconductive film (I) in example 10 had 3.18 in Al/(Zn+Al)(ratio of the number of atoms). When the compositions of the films were measured by using the same method, it was found that in each of the cases, a transparent electroconductive film having the same composition as the target composition could be obtained.

Each of the multilayer transparent electroconductive films obtained in examples 9 and 10 had a surface resistance of 25 Ω/□ or less, a surface roughness (Ra) of 35 nm or more, and a haze ratio of 10% or more. When the surface SEM observation was carried out on the laminate, it was found that the resulting film was composed of large grains with large surface unevenness. Therefore, since the multilayer transparent electroconductive films obtained in examples 9 and 10 were superior in conductivity and also superior in light confinement effect, they could be very effectively used as a surface electrode for a solar cell.

Comparative Examples 5 and 6

In comparative examples 5 and 6, the same sequence of processes as those of example 8 were carried out except that the target for use in manufacturing the transparent electroconductive film (I) was changed to a zinc-oxide-based sintered body target (made by Sumitomo Metal Mining Co., Ltd.) containing only aluminum at a rate shown below, with the film thicknesses of the transparent electroconductive film (I) and the transparent electroconductive film (II) being further changed, so that a transparent electroconductive laminate was manufactured. That is, the transparent electroconductive film (I) in comparative example 5 had 0.40 in Al/(Zn+Al) (ratio of the number of atoms) and the transparent electroconductive film (I) in comparative example 6 had 3.98 in Al/(Zn+Al)(ratio of the number of atoms). When the compositions of the films were measured by using the same method, it was found that in each of the cases, a transparent electroconductive film having the same composition as the target composition could be obtained.

Although the multilayer transparent electroconductive films obtained in comparative examples 5 and 6 had sufficient values in the haze ratio and surface roughness (Ra), they had a surface resistance greater than 25 Ω/□. Therefore, it was found that since the multilayer transparent electroconductive films obtained in comparative examples 5 and 6 were inferior in conductivity, they were not utilized as a surface electrode for a solar cell.

Example 11

In example 11, the target compositions to be used upon manufacturing the transparent electroconductive film (I) and the transparent electroconductive film (II) were changed as described below, and by using the same film-forming apparatus, a multilayer transparent electroconductive film was manufactured. That is, as each of the targets, a zinc-oxide-based sintered body containing only aluminum as an added element was used, and in the transparent electroconductive film (I), the content thereof was set to 1.59 in Al/(Zn+Al) (ratio of the number of atoms) and in the transparent electroconductive film (II), the content thereof was set to 0.31 in Al/(Zn+Al)(ratio of the number of atoms).

The multilayer transparent electroconductive film obtained in example 11 had a surface resistance of 25 Ω/□ or less, a surface roughness (Ra) of 35 nm or more, and a haze ratio of 10% or more. When the surface SEM observation was carried out on the multilayer transparent electroconductive film, it was found that the resulting film was composed of large grains with large surface unevenness. Therefore, since the multilayer transparent electroconductive film obtained in example 11 was superior in conductivity and also superior in light confinement effect, it was very effectively used as a surface electrode for a solar cell.

Examples 12 and 13

In examples 12 and 13, the same sequence of processes as those of example 11 were carried out except that the target for use in manufacturing the transparent electroconductive film (II) was changed to a zinc-oxide-based sintered body target (made by Sumitomo Metal Mining Co., Ltd.) containing only aluminum at a rate shown below, with the film thicknesses of the transparent electroconductive film (I) and the transparent electroconductive film (II) being further changed, so that a transparent electroconductive laminate was manufactured. That is, the transparent electroconductive film (II) of example 12 had 0.43 in Ga/(Zn+Ga)(ratio of the number of atoms) and the transparent electroconductive film (II) of example 13 had 0.65 in Ga/(Zn+Ga)(ratio of the number of atoms). The compositions of the films were measured by using the same method, and it was found that in each of the cases, a film having the same composition as the target composition could be obtained.

Each of the multilayer transparent electroconductive films obtained in examples 12 and 13 had a surface resistance of 25 Ω/□ or less, a surface roughness (Ra) of 35 nm or more, and a haze ratio of 10% or more. When the surface SEM observation was carried out on the laminate, it was found that the resulting film was composed of large grains with large surface unevenness. Therefore, since the multilayer transparent electroconductive films obtained in examples 12 and 13 were superior in conductivity and also superior in light confinement effect, they were very effectively used as a surface electrode for a solar cell.

Comparative Examples 7 and 8

In comparative examples 7 and 8, the same sequence of processes as those of example 11 were carried out except that the target for use in manufacturing the transparent electroconductive film (II) was changed to a zinc-oxide-based sintered body target (made by Sumitomo Metal Mining Co., Ltd.) containing only aluminum at a rate shown below, with the film thicknesses of the transparent electroconductive film (I) and the transparent electroconductive film (II) being changed, so that a transparent electroconductive laminate was manufactured. That is, the transparent electroconductive film (II) of comparative example 7 had 0.22 in Al/(Zn+Al)(ratio of the number of atoms) and the transparent electroconductive film (II) of comparative example 8 had 0.71 in Al/(Zn+Al) (ratio of the number of atoms). The compositions of the films were measured by using the same method, and it was found that in each of the cases, a film having the same composition as the target composition could be obtained.

The multilayer transparent electroconductive film obtained in comparative example 7 had sufficient values in the haze ratio and surface roughness (Ra); however, its surface resistance was greater than 25 Ω/□. Therefore, since the multilayer transparent electroconductive film obtained in comparative example 7 was inferior in conductivity, it was not applicable to a surface electrode for use in a solar cell.

Moreover, the multilayer transparent electroconductive film obtained in comparative example 8 had a sufficiently low value in surface resistance; however, it failed to provide a sufficient value in the haze ratio and surface roughness (Ra). Therefore, it was found that since the multilayer transparent electroconductive film obtained in comparative example 8 was inferior in light confinement effect, it was not applicable to a surface electrode for use in a solar cell.

Example 14

In example 14, the same sequence of processes as example 1 were carried out except that the targets to be used upon manufacturing the transparent electroconductive film (I) and the transparent electroconductive film (II) were changed to zinc-oxide-based sintered body targets (made by Sumitomo Metal Mining Co., Ltd.) respectively containing only aluminum and gallium at the following rates, with the respective film thicknesses of the transparent electroconductive film (I) and the transparent electroconductive film (II) being further changed, so that a multilayer transparent electroconductive film was manufactured. That is, the target compositions of the transparent electroconductive film (I) were set to 0.98 in Al/(Zn+Al)(ratio of the number of atoms) and 1.97 in Ga/(Zn+Ga)(ratio of the number of atoms). Moreover, the target compositions of the transparent electroconductive film (II) were set to 0.28 in Al/(Zn+Al)(ratio of the number of atoms) and 0.28 in Ga/(Zn+Ga)(ratio of the number of atoms). The compositions of the films were measured by using the same method, and it was found that in each of the cases, a film having the same composition as the target composition could be obtained.

The multilayer transparent electroconductive film obtained in example 14 had a surface resistance of 25 Ω/□ or less, a surface roughness (Ra) of 35 nm or more, and a haze ratio of 10% or more. When the surface SEM observation was carried out on the multilayer transparent electroconductive film, it was found that the resulting film was composed of large grains with large surface unevenness. Therefore, since the multilayer transparent electroconductive film obtained in example 14 was superior in conductivity and also superior in light confinement effect, it was very effectively used as a surface electrode for a solar cell.

Examples 15 to 18

In examples 15 to 18, the same sequence of processes as those of example 14 were carried out except that the transparent electroconductive film (I) and the transparent conductive film (II) respectively having the contents of aluminum and gallium shown in Table 1 were stacked so that a transparent electroconductive laminate was manufactured. The target compositions used for manufacturing the respective films are the same in the respective films.

Each of the multilayer transparent electroconductive films obtained in examples 15 to 18 had a surface resistance of 25 Ω/□ or less, a surface roughness (Ra) of 35 nm or more, and a haze ratio of 10% or more. When the surface SEM observation was carried out on the laminate, it was found that the resulting film was composed of large grains with large surface unevenness. Therefore, since the multilayer transparent electroconductive films obtained in examples 15 to 18 were superior in conductivity and also superior in light confinement effect, they were very effectively used as a surface electrode for a solar cell.

As described above, in examples 1 to 7, the target composition of the transparent electroconductive film (I) is kept within a range in which [Al]=0 and 1.74≤[Ga]≤6.10 are satisfied in a region (A) shown in FIG. 1. Moreover, in examples 1 to 7, the target composition of the transparent electroconductive film (II) is kept within a range in which [Al]=0 and 0.30≤[Ga]≤1.74 are satisfied in a region (B) shown in FIG. 1. That is, the target composition of the transparent electroconductive film (I) satisfies the aforementioned inequality (9), and the target composition of the transparent electroconductive film (II) also satisfies the inequality (10). For this reason, the transparent electroconductive laminates obtained in examples 1 to 7 have a surface resistance of 25 Ω/□ or less, a surface roughness (Ra) of 35 nm or more, and a haze ratio of 10% or more.

In examples 8 to 13, the target composition of the transparent electroconductive film (I) is kept within a range in which 0.80≤[Al]≤3.18 and [Ga]=0 are satisfied in the region (A) shown in FIG. 1. Moreover, in examples 1 to 7, the target composition of the transparent electroconductive film (II) is kept within a range in which 0.30≤[Al]≤0.65 and [Ga]=0 are satisfied in the region (B) shown in FIG. 1. That is, the target composition of the transparent electroconductive film (I) satisfies the aforementioned inequality (9), and the target composition of the transparent electroconductive film (II) also satisfies the inequality (10). For this reason, the transparent electroconductive laminates obtained in examples 8 to 13 have a surface resistance of 25 Ω/□ or less, a surface roughness (Ra) of 35 nm or more, and a haze ratio of 10% or more.

Moreover, in examples 14 to 18, the target composition of the transparent electroconductive film (I) is kept within a range in which 0.80≤[Al]≤3.18 and 1.74≤[Ga]≤6.10 are satisfied in the region (A) shown in FIG. 1. Moreover, in examples 1 to 7, the target composition of the transparent electroconductive film (II) is kept within a range in which 0.30≤[Al]≤0.65 and 0.30≤[Ga]≤1.74 are satisfied in the region (B) shown in FIG. 1. That is, the target composition of the transparent electroconductive film (I) satisfies the aforementioned inequality (9), and the target composition of the transparent electroconductive film (II) also satisfies the inequality (10). For this reason, the transparent electroconductive laminates obtained in examples 1 to 7 have a surface resistance of 25 Ω/□ or less, a surface roughness (Ra) of 35 nm or more, and a haze ratio of 10% or more.

The invention claimed is:

1. A multilayer transparent electroconductive film comprising:
a transparent electroconductive film (I) configured to be in direct contact with a substrate, mainly composed of zinc oxide; and a transparent electroconductive film (II) mainly composed of zinc oxide, having a composition different from a composition of the transparent electroconductive film (I), and being stacked on the transparent electroconductive film (I), wherein;
the transparent electroconductive film (I) has a film thickness in a range of from 200 to 700 nm and the transparent electroconductive film (II) has a film thickness in a range of from 300 to 2200 nm,
the transparent electroconductive film (I) contains one or more added elements selected from the group consisting of aluminum and gallium in an amount in a range represented by inequality (1), and
the transparent electroconductive film (II) contains only aluminum and/or gallium as added elements in an amount in a range represented by inequality (2), $$-2.18\times[Al]+1.74\leq[Ga]\leq-1.92\times[Al]+6.10 \quad (1)$$

$$-[Al]+0.30\leq[Ga]\leq-2.68\times[Al]+1.74 \quad (2)$$

where:
[Al] represents an aluminum content expressed as an atomic ratio (%), Al/(Zn+Al), and
[Ga] represents a gallium content expressed as an atomic ratio (%), Ga/(Zn+Ga).

2. The multilayer transparent electroconductive film according to claim 1, wherein the transparent electroconductive film (II) has a surface roughness (Ra) of 35.0 nm or more and a surface resistance of 25 Ω/□ or less.

3. The multilayer transparent electroconductive film according to claim 2, having a haze ratio of 10% or more.

4. The multilayer transparent electroconductive film according to claim 1, having a haze ratio of 10% or more.

5. The multilayer transparent electroconductive film according to claim 1, wherein the transparent electroconductive film (II) has a surface roughness (Ra) of 35.0 nm or more and a surface resistance of 25 Ω/□ or less.

6. The multilayer transparent electroconductive film according to claim 5, having a haze ratio of 10% or more.

7. The multilayer transparent electroconductive film according to claim 1, having a haze ratio of 10% or more.

8. The multilayer transparent electroconductive film according to claim 1, wherein aluminum and/or gallium are the only added elements in the transparent electroconductive film (I) mainly composed of zinc oxide.

9. A method for manufacturing a multilayer transparent electroconductive film, comprising:
forming a transparent electroconductive film (I) configured to be in direct contact with a substrate, mainly composed of zinc oxide via a sputtering method in which:
a sputtering target is an oxide sintered body target that is mainly composed of zinc oxide and contains one or more added elements selected from the group consisting of aluminum and gallium in an amount in a range represented by inequality (1),
a sputtering gas pressure is in a range of from 0.1 to 0.8 Pa, and
a substrate temperature is in a range of from room temperature to 400° C.,
forming a transparent electroconductive film (II) mainly composed to zinc oxide via a sputtering method in which:
a sputtering target is an oxide sintered body target that is mainly composed of zinc oxide and contains only aluminum and gallium as added elements in an amount in a range represented by inequality (2),
a sputtering gas pressure is in a range of from 2.0 to 15.0 Pa, and
a substrate temperature is in a range of from 300 to 600° C., and
stacking the transparent electroconductive film (II) on the transparent electroconductive film (I), $$-2.18\times[Al]+1.74\leq[Ga]\leq-1.92\times[Al]+6.10 \quad (1)$$

$$-[Al]+0.30\leq[Ga]\leq-2.68\times[Al]+1.74 \quad (2)$$

where:
[Al] represents an aluminum content expressed as an atomic ratio (%), Al/(Zn+Al), and
[Ga] represents a gallium content expressed as an atomic ratio (%), Ga/(Zn+Ga)
wherein:
the transparent electroconductive film (I) has a film thickness in a range of from 200 to 700 nm and the transparent electroconductive film (II) has a film thickness in a range of from 300 to 2200 nm.

10. The method for manufacturing a multilayer transparent electroconductive film according to claim 9, further comprising annealing the transparent electroconductive film (I) and the transparent electroconductive film (II), in vacuum or in a reducing atmosphere.

11. A thin-film solar cell comprising:
a multilayer transparent electroconductive film, a photoelectric conversion layer unit, and a back electrode layer that are successively stacked on a translucent substrate,
wherein:
the multilayer transparent electroconductive film comprises:
a transparent electroconductive film (I) configured to be in direct contact with a substrate, mainly composed of zinc oxide; and
a transparent electroconductive film (II) mainly composed of zinc oxide, having a composition different from a composition of the transparent electroconductive film (I), and being stacked on the transparent electroconductive film (I),
the transparent electroconductive film (I) contains one or more added elements selected from the group consisting of aluminum and gallium in an amount in a range represented by inequality (1), and
the transparent electroconductive film (II) contains one or more added elements selected from the group consisting of aluminum and gallium in an amount in a range represented by inequality (2), $$-2.18\times[Al]+1.74\leq[Ga]\leq-1.92\times[Al]+6.10 \quad (1)$$

$$-[Al]+0.30\leq[Ga]\leq-2.68\times[Al]+1.74 \quad (2)$$

where:
[Al] represents an aluminum content expressed as an atomic ratio (%), Al/(Zn+Al), and
[Ga] represents a gallium content expressed as an atomic ratio (%), Ga/(Zn+Ga).

12. A method for manufacturing a thin-film solar cell comprising: a multilayer transparent electroconductive film, a photoelectric conversion layer unit and a back electrode layer that are successively stacked on a translucent substrate, the method comprising:
forming a transparent electroconductive film (I) configured to be in direct contact with a substrate, mainly composed of zinc oxide via a sputtering method in which:
a sputtering target is an oxide sintered body target that is mainly composed of zinc oxide and contains one or more added elements selected from the group consisting of aluminum and gallium in an amount in a range represented by inequality (1),
a sputtering gas pressure is in a range from 0.1 to 0.8 Pa, and
a substrate temperature is in a range of from room temperature to 400° C., and
forming a transparent electroconductive film (II) mainly composed of zinc oxide via a sputtering method in which:
a sputtering target is an oxide sintered body target that is mainly composed of zinc oxide and contains one or more added elements selected from the group consisting of aluminum and gallium in an amount in a range represented by inequality (2),
a sputtering gas pressure in a range from 2.0 to 15.0 Pa, and
a substrate temperature in a range from 300 to 600° C., and
stacking the transparent electroconductive film (II) on the transparent electroconductive film (I), $$-2.18 \times [Al] + 1.74 \leq [Ga] \leq -1.92 \times [Al] + 6.10 \quad (1)$$

$$-[Al] + 0.30 \leq [Ga] \leq -2.68 \times [Al] + 1.74 \quad (2)$$

where:
[Al] represents an aluminum content expressed as an atomic ratio (%), Al/(Zn+Al), and
[Ga] represents a gallium content expressed as an atomic ratio (%), Ga/(Zn+Ga).

* * * * *